(12) United States Patent
Liu et al.

(10) Patent No.: US 12,495,539 B2
(45) Date of Patent: Dec. 9, 2025

(54) SEMICONDUCTOR STRUCTURE, METHOD FOR MANUFACTURING SAME, AND MEMORY

(71) Applicant: CHANGXIN MEMORY TECHNOLOGIES, INC., Hefei (CN)

(72) Inventors: Youming Liu, Hefei (CN); Deyuan Xiao, Hefei (CN); Yi Jiang, Hefei (CN); Guangsu Shao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 519 days.

(21) Appl. No.: 18/157,073

(22) Filed: Jan. 20, 2023

(65) Prior Publication Data

US 2023/0345706 A1    Oct. 26, 2023

Related U.S. Application Data

(63) Continuation of application No. PCT/CN2022/104019, filed on Jul. 6, 2022.

(30) Foreign Application Priority Data

Apr. 26, 2022 (CN) .......................... 202210446021.0

(51) Int. Cl.
  *H10B 12/00* (2023.01)
(52) U.S. Cl.
  CPC .......... *H10B 12/34* (2023.02); *H10B 12/053* (2023.02); *H10B 12/482* (2023.02)

(58) Field of Classification Search
  CPC ...... H10B 12/05; H10B 12/053; H10B 12/34; H10B 12/482; H10B 12/488; H10D 30/6735; H10D 30/6757; H10D 53/20
  See application file for complete search history.

(56) References Cited

U.S. PATENT DOCUMENTS

| | | |
|---|---|---|
| 7,074,700 B2 | 7/2006 | Huang |
| 8,294,209 B2 | 10/2012 | Jeon |
| 8,829,598 B2 | 9/2014 | Lim |
| 10,381,409 B1 | 8/2019 | Zhou |
| 10,468,532 B1 | 11/2019 | Reznicek |
| 10,559,692 B2 | 2/2020 | Reznicek |
| 10,937,808 B2 | 3/2021 | Lee |
| 11,329,046 B2 | 5/2022 | Choi |

(Continued)

FOREIGN PATENT DOCUMENTS

| | | |
|---|---|---|
| CN | 111384063 A | 7/2020 |
| CN | 111435641 A | 7/2020 |

(Continued)

*Primary Examiner* — Hoai V Pham
(74) *Attorney, Agent, or Firm* — Syncoda LLC; Feng Ma

(57) ABSTRACT

A method for manufacturing a semiconductor structure includes: providing a substrate; and forming a plurality of columns of stacked structures arranged at intervals in a first direction on the substrate, each stacked structures including a plurality of first sacrificial layers and a plurality of active layers that are stacked alternately. Part of each of the first sacrificial layers is removed to form a first trench and a second trench, and part of each of the active layers is exposed from the first trench and the second trench. Next, the exposed active layers are doped by ion doping to form first doped areas and second doped areas.

12 Claims, 31 Drawing Sheets

(56) References Cited

U.S. PATENT DOCUMENTS

| | | |
|---|---|---|
| 11,348,999 B2 | 5/2022 | Reznicek |
| 11,424,269 B2 | 8/2022 | Lee |
| 2005/0064643 A1 | 3/2005 | Huang |
| 2006/0240622 A1 | 10/2006 | Lee |
| 2010/0213524 A1 | 8/2010 | Jeon |
| 2010/0314678 A1 | 12/2010 | Lim |
| 2013/0175602 A1 | 7/2013 | Lim et al. |
| 2019/0341496 A1 | 11/2019 | Reznicek et al. |
| 2020/0006569 A1 | 1/2020 | Reznicek et al. |
| 2020/0212068 A1 | 7/2020 | Lee et al. |
| 2021/0183862 A1 | 6/2021 | Son et al. |
| 2021/0183890 A1 | 6/2021 | Lee et al. |
| 2021/0202488 A1 | 7/2021 | Choi |
| 2021/0288141 A1 | 9/2021 | Reznicek et al. |
| 2022/0238527 A1 | 7/2022 | Choi |
| 2024/0040787 A1* | 2/2024 | Manthena ............ H10B 43/10 |

FOREIGN PATENT DOCUMENTS

| | | |
|---|---|---|
| CN | 111435642 A | 7/2020 |
| CN | 111435643 A | 7/2020 |
| CN | 113130494 A | 7/2021 |

\* cited by examiner

SEMICONDUCTOR STRUCTURE, METHOD FOR MANUFACTURING SAME, AND MEMORY

CROSS-REFERENCE TO RELATED APPLICATIONS

This is a continuation application of International Application No. PCT/CN2022/104019 filed on Jul. 6, 2022, which claims priority to Chinese Patent Application No. 202210446021.0 filed on Apr. 26, 2022. The disclosures of the above-referenced applications are hereby incorporated by reference in their entirety.

BACKGROUND

A dynamic random access memory (DRAM) is a semiconductor memory capable of writing and reading data at a high speed randomly, and is widely applied to a data storage device or apparatus. The DRAM is composed of a plurality of repeated memory cells. Each memory cell generally includes a capacitor and a transistor. The capacitor stores data information. The transistor controls the reading of the data information in the capacitor.

In order to improve the storage capacity of a semiconductor structure, the semiconductor structure has been developed from a two-dimensional structure to a three-dimensional structure. However, it is difficult to dope an active area of the semiconductor structure during forming the three-dimensional semiconductor structure, which reduces the yield of semiconductor structures while improving the difficulty in manufacturing the semiconductor structure.

SUMMARY

Embodiments of the disclosure relate to the technical field of semiconductors, and in particular to a semiconductor structure, a method for manufacturing same, and a memory.

In view this, embodiments of the disclosure provide a semiconductor structure, a method for manufacturing the same, and a memory, which are used for reducing the difficulty in manufacturing an active layer.

In a first aspect, embodiments of the disclosure provide a method for manufacturing a semiconductor structure, which includes the following operations.

A substrate is provided.

A plurality of columns of stacked structures arranged at intervals in a first direction are formed on the substrate. Each stacked structure includes a plurality of first sacrificial layers and a plurality of active layers that are stacked alternately.

Part of each of the first sacrificial layers is removed to form a first trench and a second trench arranged at intervals in a second direction. Part of a surface of each of the active layers is exposed in the first trench and the second trench. The second direction intersects the first direction, and both the first direction and the second direction are parallel to a surface of the substrate.

Ion doping is performed on each of the exposed active layers to form a first doped area and a second doped area arranged at an interval in each of the active layers. The active layer located between the first doped area and the second doped area forms a channel area.

In a second aspect, embodiments of the disclosure provide a semiconductor structure. The semiconductor structure is prepared by the method for manufacturing a semiconductor structure provided in the first aspect.

In a third aspect, embodiments of the disclosure provide a memory. The memory includes the semiconductor structure provided in the second aspect, and further includes a memory structure and a bit line structure. The memory structure is electrically connected to one of the first doped area and the second doped area, and the bit line structure is electrically connected to the other one of the first doped area and the second doped area.

BRIEF DESCRIPTION OF THE DRAWINGS

In order to more clearly illustrate the technical solutions of the embodiments of the disclosure or of some implementations, a brief description of the drawings used in the description of the embodiments or some implementations will be provided below. It is apparent that the drawings in the following description are merely some embodiments of the disclosure. Other drawings can be obtained by those skilled in the art based on these drawings without creative work.

REFERENCE NUMERALS

10—substrate; 11—first area; 12—second area; 13—third area; 20—stacked structure; 21—first sacrificial layer; 211—first trench; 212—second trench; 22—active layer; 221—first doped area; 222—second doped area; 223—channel area; 23—first initial sacrificial layer; 24—initial active layer; 25—third trench; 30—mask layer; 31—first opening; 40—second sacrificial layer; 50—etched hole; 51—first etched hole; 52—second etched hole; 60—second photoresist layer; 70—third etched hole; 80—first support structure; 90—second support structure; 100—filling area; 100*a*—first filling area; 100*b*—second filling area; 110—dielectric layer; 111—fourth trench; 120—gate oxide layer; 130—conductive layer; 140—fifth trench; 150—insulating layer; 160—memory structure; 170—bit line structure; 180—isolation layer; and 190—word line structure.

DETAILED DESCRIPTION

As described in the background, since a plurality of active layers are overlapped in the vertical direction when a three-dimensional semiconductor structure is manufactured in some implementations, it is difficult to perform ion doping on the active layers to form source/drain areas, which can reduce the yield of semiconductor structures. On this basis, in the method for manufacturing a semiconductor structure provided by the embodiments of disclosure, part of first sacrificial layers are removed to form first trenches and second trenches, and part of active layers are exposed from the first trenches and the second trenches. Next, the exposed active layers may be doped by ion doping to form first doped areas and second doped areas, so that the yield of the semiconductor structures is improved while reducing the difficulty in manufacturing the semiconductor structures.

In order to make the abovementioned objects, features, and advantages of the embodiments of the disclosure more obvious and understandable, technical solutions in the embodiments of the disclosure will be clearly and completely described below with reference to the drawings in the embodiments of the disclosure. It is apparent that the described embodiments are only a part of the embodiments of the disclosure, not all of them. Based on the embodiments of the disclosure, any other embodiments obtained by those of ordinary skill in the art without creative efforts fall within the protection scope of the disclosure.

Without limitation to the semiconductor structure in the embodiments, the semiconductor structure will be described below taking a dynamic random access memory (DRAM) as an example, but the embodiments are not limited thereto. The semiconductor structure in the embodiments may also be other structures.

Figure 1:
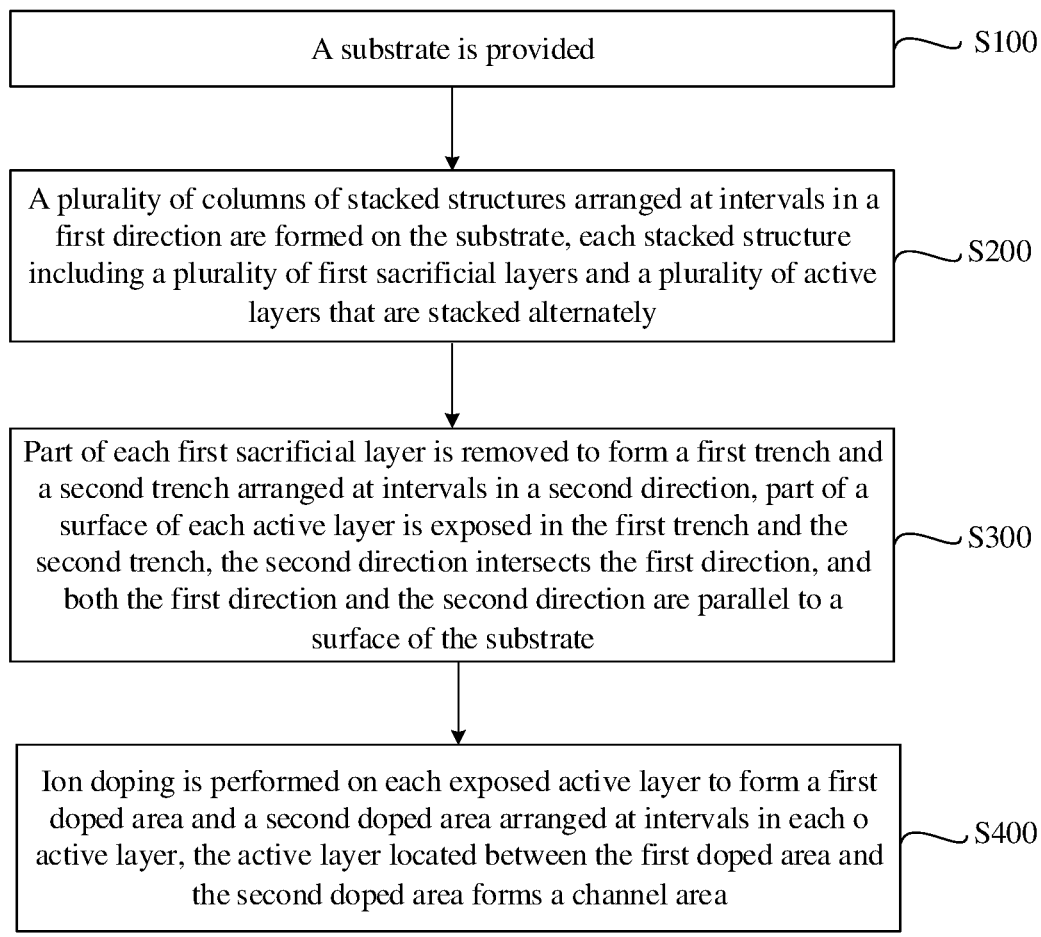
FIG. 1 is a flowchart showing a method for manufacturing a semiconductor structure provided by an embodiment of the disclosure.

Referring to FIG. 1, the method for manufacturing a semiconductor structure provided by an embodiment of the disclosure includes the following operations.

At S100, a substrate is provided.

Figure 2:
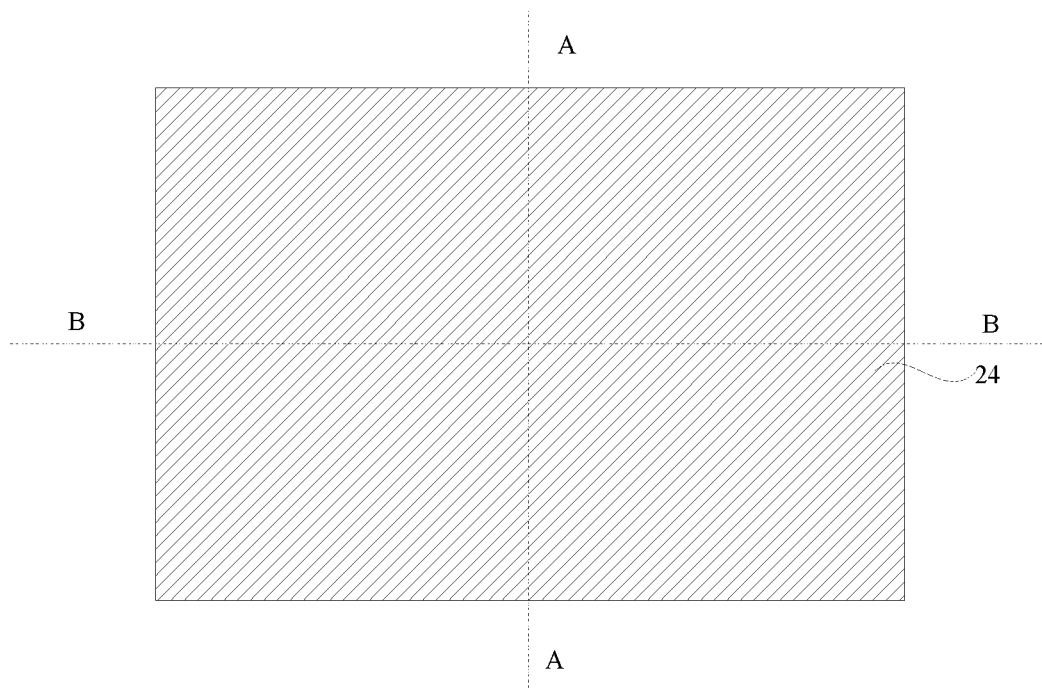
FIG. 2 is a schematic structural diagram of forming a first initial sacrificial layer and an initial active layer in the method for manufacturing a semiconductor structure provided by an embodiment of the disclosure.
Figure 3:
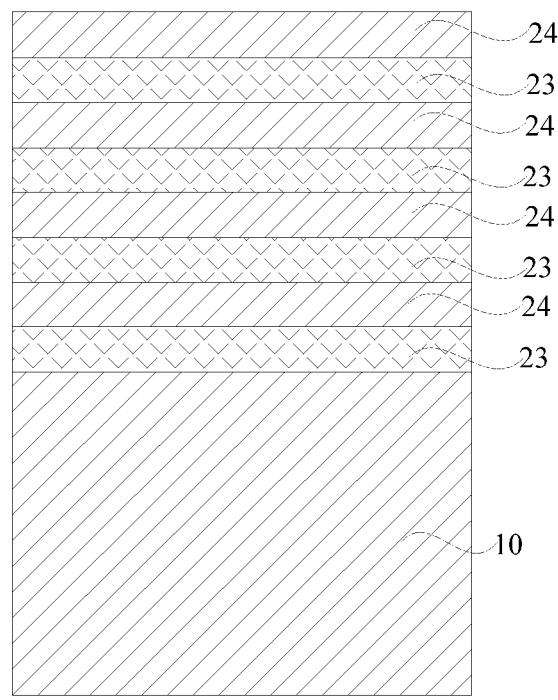
FIG. 3 is a sectional view in direction A-A in FIG. 2.

Referring to FIG. 2 and FIG. 3, the substrate 10 is provided and configured to support film layers thereon. The substrate 10 may be a semiconductor substrate. For example, the substrate 10 may be a silicon substrate, a germanium substrate, a silicon carbide (SiC), a silicon germanium (SiGe) substrate, a germanium on insulator (GOI) substrate, a silicon on insulator (SOI) substrate, or the like.

At S200, a plurality of columns of stacked structures arranged at intervals in a first direction are formed on the substrate. Each stacked structure includes a plurality of first sacrificial layers and a plurality of active layers that are stacked alternately.

For example, the first initial sacrificial layers 23 and the initial active layers 24 that are stacked alternately are formed on the substrate 10. That is, a plurality of initial active layers 24 and a plurality of first initial sacrificial layers 23 are formed on the substrate 10. The plurality of initial active layers 24 and the plurality of first initial sacrificial layers 23 are stacked in sequence and alternately arranged in the direction perpendicular to the substrate 10, and the first initial sacrificial layer 23 is arranged on the substrate 10. Herein, the numbers of the initial active layers 24 and the first initial sacrificial layers 23 may be set according to actual needs.

In some possible embodiments, the initial active layers 24 and the first initial sacrificial layers 23 may be formed by deposition. The deposition process may include chemical vapor deposition (CVD), physical vapor deposition (PVD), atomic layer deposition (ALD), or the like.

In some other possible embodiments, the first initial sacrificial layers 23 may be formed by epitaxy (EPI). Therefore, the problem of lattice mismatch between the first initial sacrificial layer 23 and the initial active layer 24 and between the first initial sacrificial layer 23 and the substrate 10 can be avoided, the stresses generated between the interface of the first initial sacrificial layer 23 and the substrate 10 and between the interfaces of the first initial sacrificial layers 23 and the initial active layers 24 can be reduced, so that the stability of the subsequently formed semiconductor structure is improved.

The material of the first initial sacrificial layers 23 includes SiGe or silicon phosphide, so that the first initial sacrificial layers 23 may have a greater etching selective ratio to the initial active layers 24, to facilitate the selective removing of the first sacrificial layers by a subsequent process, reduce the etching of the active layers, and improve the yield of the semiconductor structures.

In the embodiment, a silicon layer with a certain thickness may be formed on the first initial sacrificial layer by deposition first, and then, the ion doping is performed on the silicon layer to form the initial active layer 24. In an example, N-type ions (ions of Group V elements such as phosphorus (P) or arsenic (As)) may be implanted into the silicon layer to form an N-type initial active layer 24. In another example, P-type ions (ions of Group III elements such as boron (B) or gallium (Ga)) may be implanted into the silicon layer to form a P-type initial active layer 24.

Figure 4:
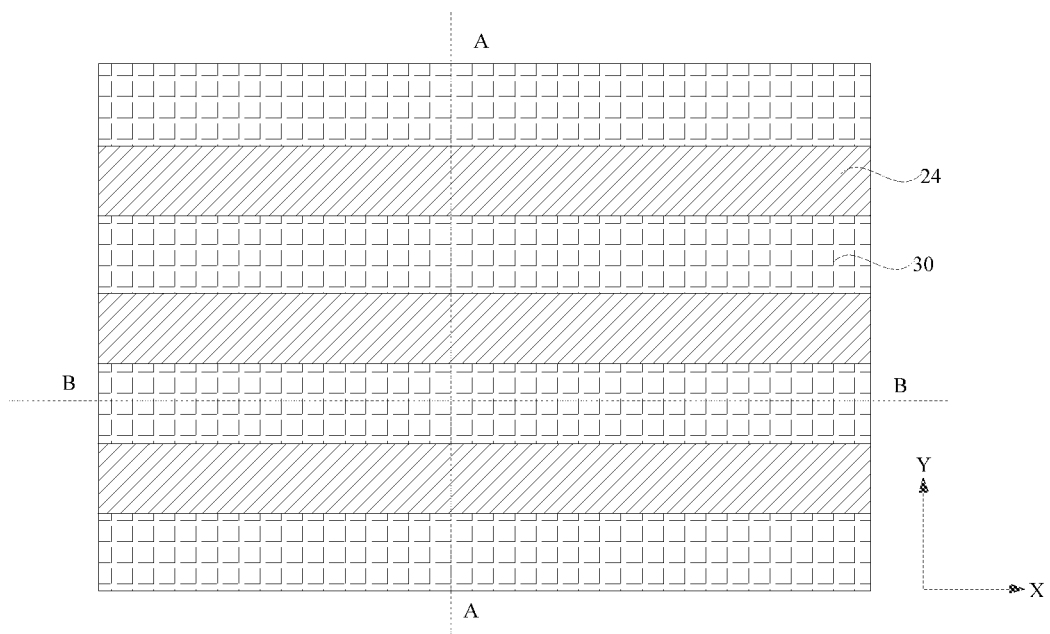
FIG. 4 is a schematic structural diagram of forming a mask layer in the method for manufacturing a semiconductor structure provided by an embodiment of the disclosure.
Figure 5:
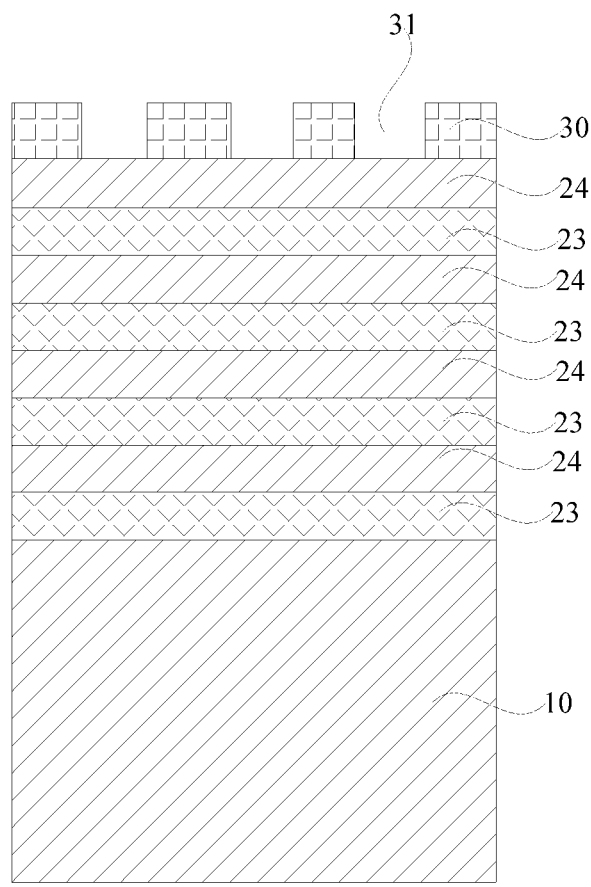
FIG. 5 is a sectional view in direction A-A in FIG. 4.

Referring to FIG. 4 and FIG. 5, after the first initial sacrificial layers 23 and the initial active layers 24 are formed, a mask layer 30 is formed on the initial active layer, and the mask layer 30 is patterned to form a plurality of openings 31 arranged at intervals in the first direction Y in the mask layer 30. Each opening 31 extends along the second direction. The second direction is the direction X in FIG. 4.

In a feasible embodiment, a first photoresist layer (not shown in the drawings) may be formed on the mask layer 30. For example, the first photoresist layer may be formed on the mask layer 30 by coating, next, a first mask pattern is formed in the first photoresist layer by exposing, developing, or etching. The first mask pattern includes a plurality of first bumps and first opening areas located between adjacent first bumps. The plurality of first bumps are arranged at intervals in the first direction, and each first bump extends along the second direction. The second direction is perpendicular to the first direction. The first direction is the direction Y in FIG. 4.

Next, the mask layer 30 exposed in the opening areas is removed by dry etching or wet etching to form a plurality of openings 31 arranged at intervals in the first direction in the mask layer 30.

Figure 6:
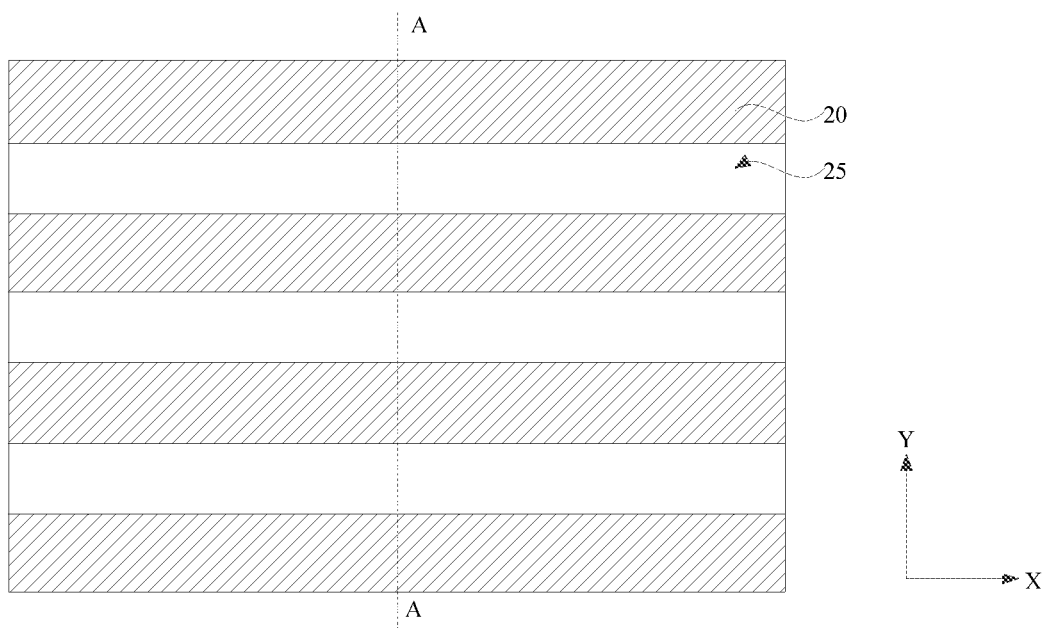
FIG. 6 is a schematic structural diagram of forming a stacked structure in the method for manufacturing a semiconductor structure provided by an embodiment of the disclosure.
Figure 7:
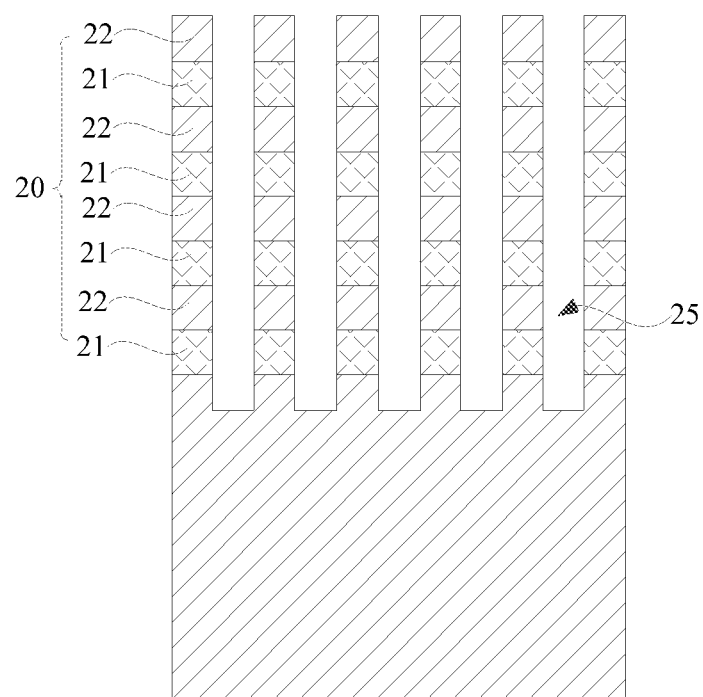
FIG. 7 is a sectional view in direction A-A in FIG. 6.

Next, referring to FIG. 6 and FIG. 7, the first initial sacrificial layers 23 and the initial active layers 24 exposed in the openings 31 are continued to be removed by dry etching or wet etching. The remaining first initial sacrificial layers 23 and the remaining initial active layers 24 form a plurality of columns of stacked structures 20, and the third trenches 25 extending along second direction are formed between two adjacent ones of the stacked structures 20.

Each stacked structure 20 includes a plurality of first sacrificial layers 21 and a plurality of active layers 22 that are stacked alternately. The first sacrificial layer 21 is arranged on the substrate 10.

It should be noted that, in the example, part thickness of substrate 10 may also continue to be removed, so that the bottoms of the third trenches 25 are located in the substrate 10. In this way, the first sacrificial layer 21 can be better removed subsequently, and the integrity of the formed active layer 22 is ensured.

The first direction is the direction Y in FIG. 6, and the second direction is the direction X in FIG. 6. It can be ensured that the extending direction of the formed active layers is parallel to the substrate, so that memory cells that are stacked in three-dimension can be formed. Compared with two-dimensional memory cells in some implementations, more memory cells may be arranged in an effective area, so that the storage capacity of the semiconductor structure is improved.

It should be noted that, in the embodiment, the mask layer 30 may be a single film layer or a laminated structure. When the mask layer 30 is a laminated structure, the mask layer 30 may include a first mask layer and a second mask layer, in which the first mask layer is arranged on the initial active layer 24, and the second mask layer is arranged on the first mask layer. In this way, the mask pattern may be transferred from the first photoresist layer into the second mask layer first, then, the first mask layer is etched by taking the second mask layer with the mask pattern as a mask, to transfer the mask pattern into the first mask layer, and finally, the plurality of first initial sacrificial layers 23 and initial active layers 24 are etched by taking the first mask layer with the mask pattern as the mask. Therefore the accuracy in the process of transferring the mask pattern can be improved, and the manufacturing accuracy of the semiconductor structure can be improved, so that the yield of the semiconductor structures is improved.

The material of the first mask layer may include silicon oxide, but is not limited thereto. The material of the second mask layer may include silicon nitride, but is not limited thereto.

At S300, part of each of the first sacrificial layers are removed to form a first trench and a second trench spaced apart from each other in a second direction, part of a surface of each active layer is exposed in the first trench and the second trench. The second direction intersects the first direction, and both the first direction and the second direction are parallel to the surface of the substrate.

Figure 8:
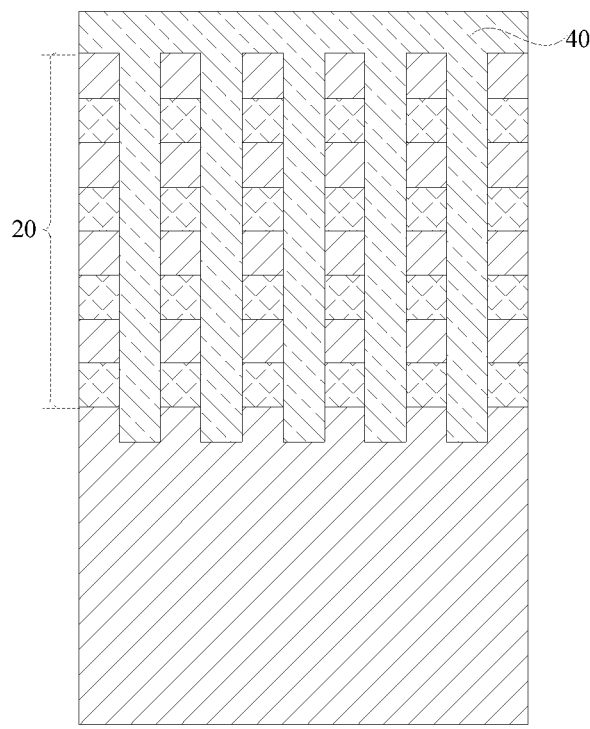
FIG. 8 is a sectional view in direction A-A after forming a second sacrificial layer in the method for manufacturing a semiconductor structure provided by an embodiment of the disclosure.
Figure 9:
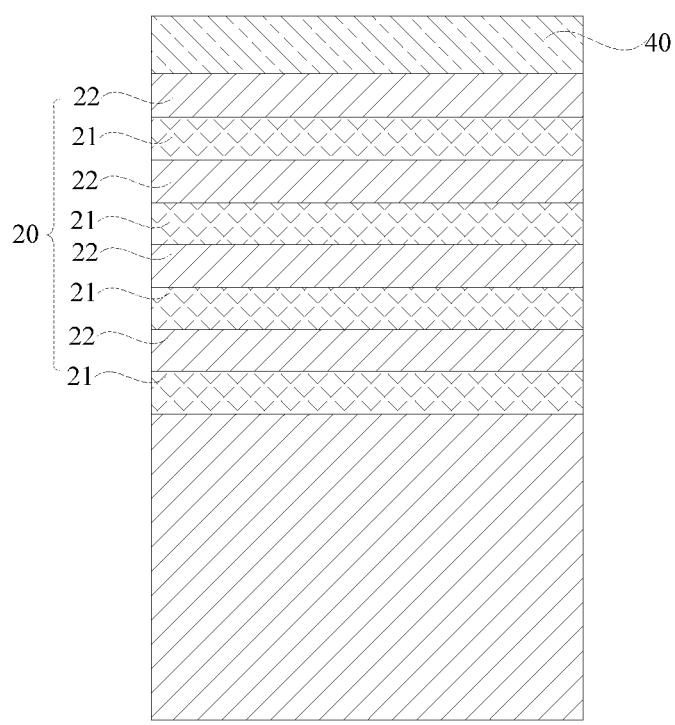
FIG. 9 is a sectional view in direction B-B after forming the second sacrificial layer in the method for manufacturing a semiconductor structure provided by the embodiment of the disclosure.

For example, referring to FIG. 8 and FIG. 9, a second sacrificial layer 40 is formed. The second sacrificial layer 40 fills the areas between any adjacent stacked structures 20 and covers top surfaces of the stacked structures 20.

The second sacrificial layer 40 is deposited in the third trenches by CVD or PVD. The second sacrificial layer 40 extends outside the third trenches 25 and covers the top surfaces of the stacked structures 20. The material of the second sacrificial layer 40 includes silicon oxide, but is not limited thereto.

It should be noted that, after the second sacrificial layer 40 is formed, the second sacrificial layer 40 may be planarized by chemical mechanical polishing (CMP), so as to ensure that the top surface of the second sacrificial layer 40 is a flat top surface, thereby facilitating subsequent manufacturing of other film layers on the second sacrificial layer 40, and improving the manufacturing accuracy of the semiconductor structure.

After that, part of the second sacrificial layer 40 is removed to form a plurality of etched holes 50 in a direction perpendicular to the substrate 10. Each of the etched holes 50 is located between two adjacent ones of the stacked structures 20 and exposes side surfaces of the stacked structures 20. Part of the first sacrificial layers 21 are removed along the etched holes 50.

Figure 10:
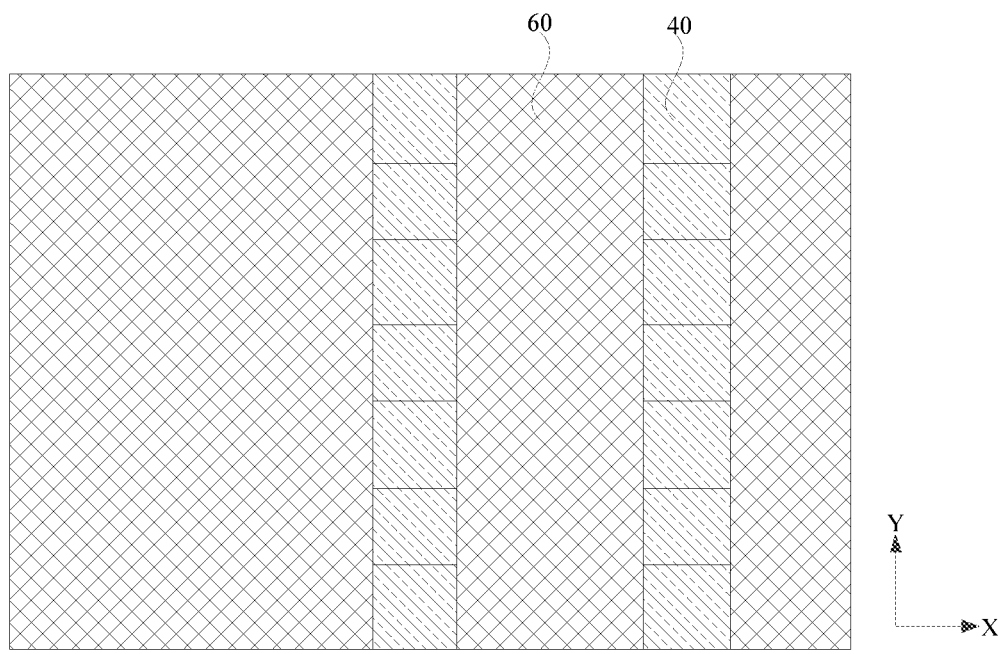
FIG. 10 is a schematic structural diagram of forming a second photoresist layer in the method for manufacturing a semiconductor structure provided by an embodiment of the disclosure.

For example, referring to FIG. 10, a second photoresist layer 60 may be formed on the second sacrificial layer 40 by coating. Next, a second mask pattern is formed in the second photoresist layer 60 by exposing, developing, or etching. The second mask pattern includes a plurality of second bumps and second opening areas located between two adjacent ones of the second bumps. The plurality of second bumps are arranged at intervals in the second direction X, and each of the second bumps extends along the first direction Y.

Figure 11:
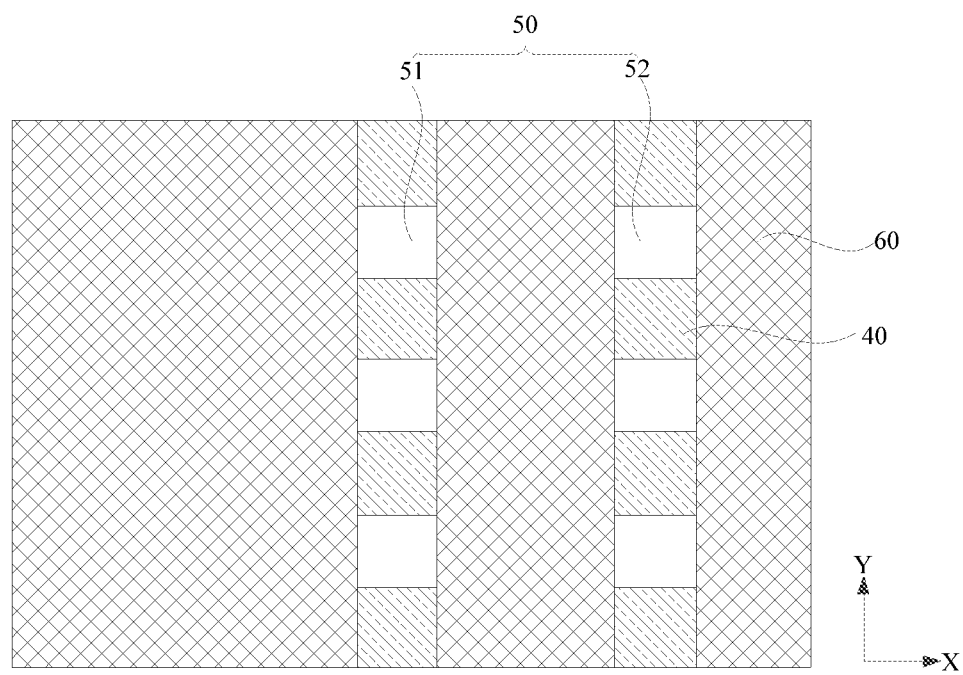
FIG. 11 is a schematic structural diagram of forming etched holes in the method for manufacturing a semiconductor structure provided by an embodiment of the disclosure.

Referring to FIG. 11, the second sacrificial layer 40 exposed in the second opening areas is removed by taking the second photoresist layer 60 as a mask, so as to form a plurality of etched holes 50 in the second sacrificial layer 40. The depth direction of the etched holes 50 is perpendicular to the substrate 10, and the etched holes 50 expose the top surface of the substrate 10.

In the first direction Y, side walls of each etched hole 50 are opposite surfaces of adjacent columns of stacked structures 20. Taking the orientation as shown in FIG. 11 as an example, each etched hole 50 exposes a front surface of one stacked structure 20 and a rear surface of an adjacent stacked structure 20. In this way, each etched hole may expose part of the first sacrificial layers, so that the part of the first sacrificial layers can be selectively removed subsequently, which ensures the normal progress for manufacturing the semiconductor structure.

In the embodiment, the plurality of etched holes 50 may be arranged in more rows and two columns, and each row of etched holes 50 are located between two adjacent ones of the stacked structures 20. The etched holes 50 may include first etched holes 51 and second etched holes 52. The active layers 22 exposed from the first etched holes 51 are configured to forming either of the subsequent first doped areas 221 or the second doped areas 222. The active layers 22 exposed from the second etched holes 52 are configured to forming the other of the subsequent first doped areas 221 or the second doped areas 222.

Figure 12:
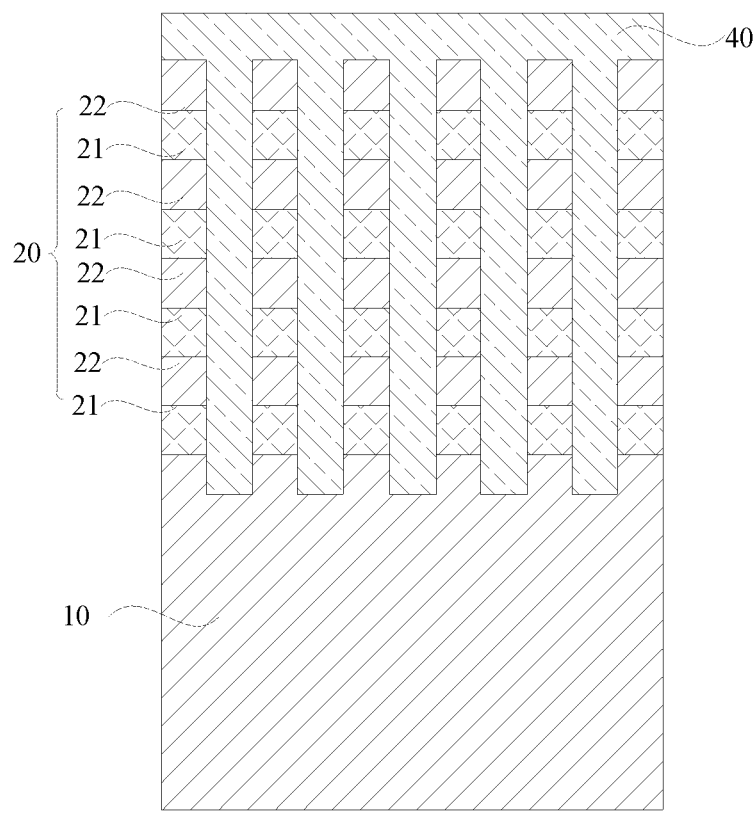
FIG. 12 is a sectional view in direction A-A after forming the etched holes in the method for manufacturing a semiconductor structure provided by the embodiment of the disclosure.
Figure 13:
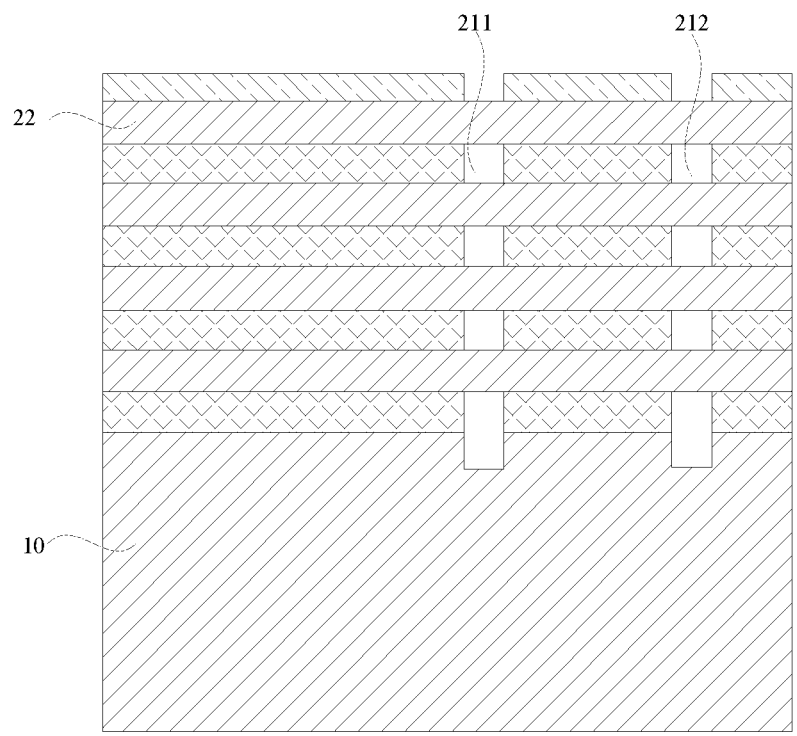
FIG. 13 is a sectional view in direction B-B after forming the etched holes in the method for manufacturing a semiconductor structure provided by the embodiment of the disclosure.

Subsequently, referring to FIG. 12 and FIG. 13, each first sacrificial layer 21 exposed in the etched holes 50 is continued to be removed by dry etching or wet etching, to form a first trench 211 and a second trench 212 in each first sacrificial layer 21. The depth direction of the first trenches 211 and the second trenches 212 is the same as the first direction Y, and the first trenches 211 and the second trenches 212 penetrate through the first sacrificial layers 21 in the first direction Y.

It should be noted that, in the second direction X, the lengths of the first trench 211 and the second trench 212 may be the same or may be different. In an example, when the lengths of the first trench 211 and the second trench 212 are the same, the areas of the subsequently formed first doped area 221 and the second doped area 222 are approximately the same. In another example, when the lengths of the first trench 211 and the second trench 212 are different, the areas of the subsequently formed first doped area 221 and the second doped area 222 are different. In this way, the performance of the semiconductor structure may be controlled purposely, which improves the usability of the semiconductor structure.

At S400, ion doping is performed on each of the exposed active layers, to form a first doped area and a second doped area spaced apart from each other in each of the active layers. The active layer located between the first doped area and the second doped area forms a channel area.

Figure 14:
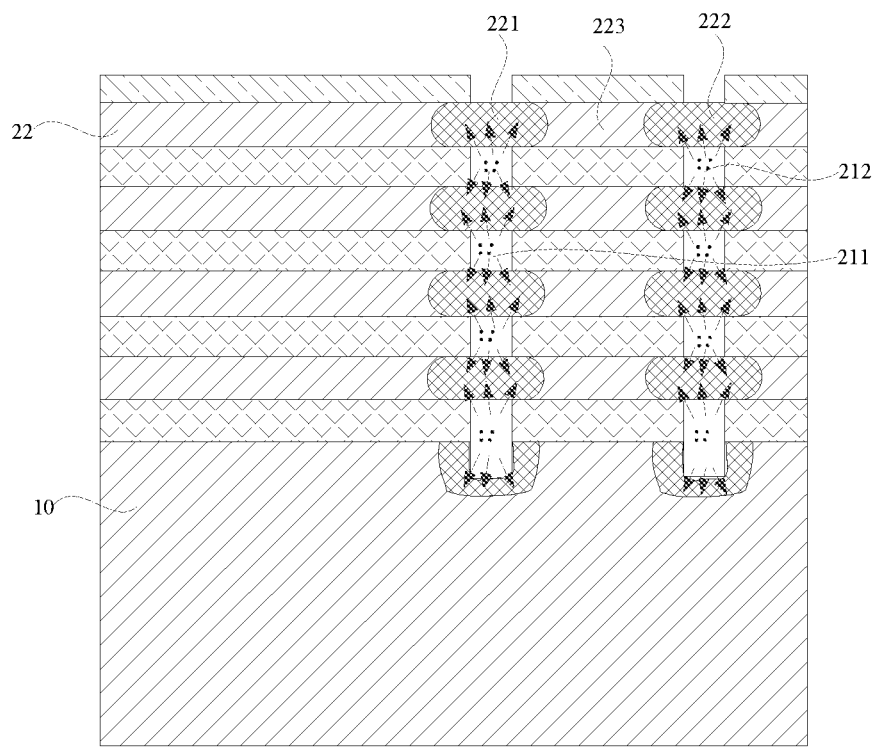
FIG. 14 is a schematic structural diagram of forming first doped areas and second doped areas in the method for manufacturing a semiconductor structure provided by an embodiment of the disclosure.

Referring to FIG. 14, the first doped areas 221 and the first doped areas 222 may be formed by ion diffusion or plasma doping system (PALD) process.

The active layer 22 located between the first doped area 221 and the second doped area 222 is a channel area 223. The types of the doping ions of the first doped area 221 and the second doped area 222 may be the same, and the type of the doping ions of the first doped area 221 may be the same as or may be different from that of the doping ions of the channel area 223.

In an example, the type of the doping ions in the first doped area 221 may be the same as that in the channel area 223. When the doping ions in the active layer 22 are N-type ions, the active layer exposed in the first trench and the second trench may be doped with N-type ions by plasma doping to increase the concentration of N-type ions in the active layer 22 exposed in the first trench 211 and the second trench 212, so that the concentration of the doped ions in the channel area 223 is lower than that in the first doped area 221 and the second doped area 222. It should be noted that when the doping ions of the active layer 22 are P-type ions, the formation of the first doped area 221 and the second doped area 222 is same as the abovementioned description, which will not be repeated in the embodiment.

In another example, the type of the doping ions in the first doped area 221 may be different from that in the channel area 223. When the doping ions in the active layer 22 are N-type ions, the active layer 22 exposed in the first trench 211 and the second trench 212 may be doped with P-type ions by plasma doping, so that a PNP structure is formed in the active layer 22. When the doping ions of the active layer 22 are P-type ions, the active layer 22 exposed in the first trench 211 and the second trench 212 may be doped with N-type ions by plasma doping, so that a NPN structure is formed in the active layer 22.

According to the embodiments, part of the first sacrificial layers is removed to form the first trenches and the second trenches, and part of the active layers are exposed from the first trenches and the second trenches. After that, the exposed active layers may be doped by ion doping to form the first doped areas and the second doped areas. Therefore, the yield of semiconductor structures is improved while reducing the difficulty in manufacturing the semiconductor structures.

In some embodiments, after the first doped areas and the second doped areas are formed, the method for manufacturing a semiconductor structure includes the following operations.

Figure 15:
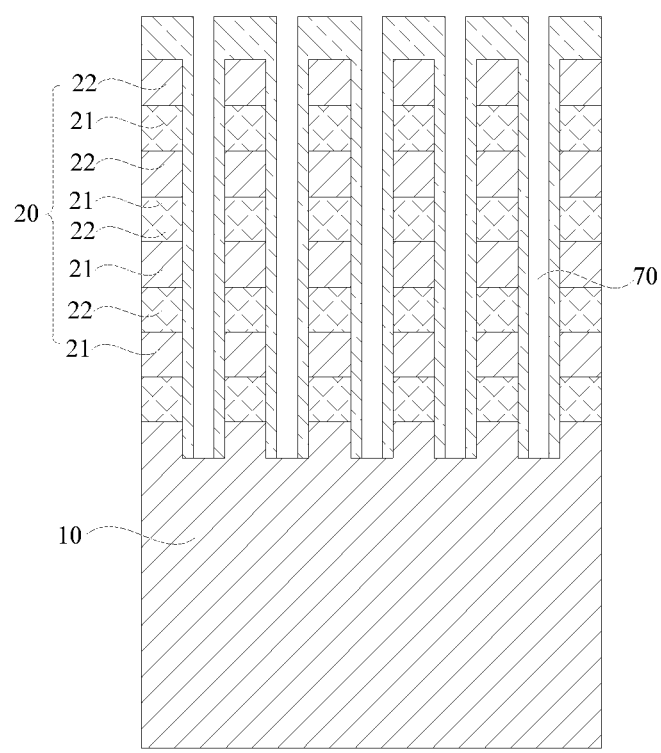
FIG. 15 is a schematic structural diagram of forming third etched holes in the method for manufacturing a semiconductor structure provided by an embodiment of the disclosure.
Figure 16:
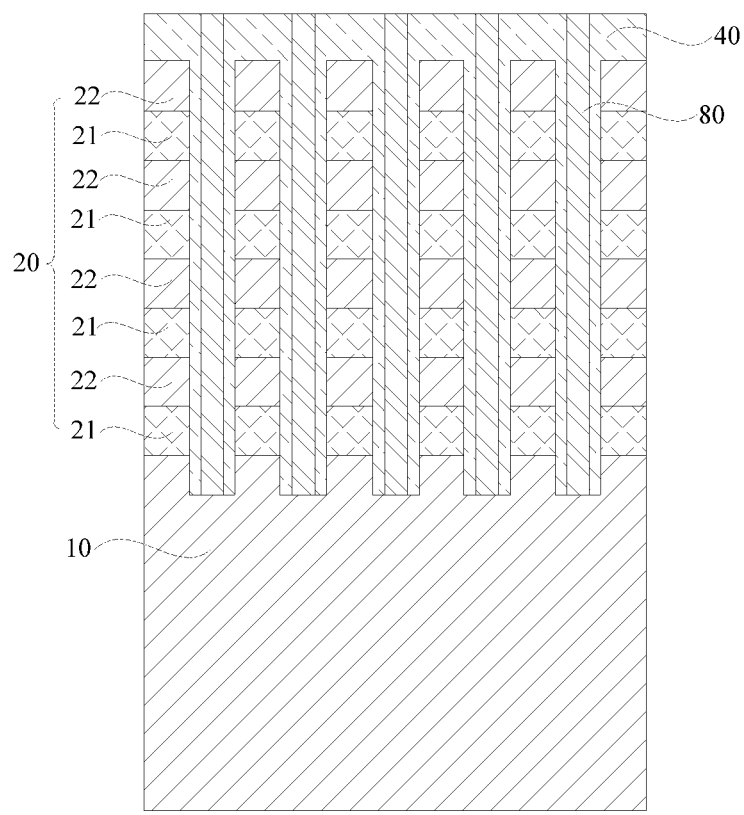
FIG. 16 is a sectional view in direction A-A after forming a support structure in the method for manufacturing a semiconductor structure provided by an embodiment of the disclosure.

Referring to FIG. 15 and FIG. 16, third etched holes 70 are formed in the second sacrificial layer 40 located between two adjacent ones of the stacked structures 20. That is, each of the third etched holes 70 is formed in the second sacrificial layer 40 located in the third trench 25, and the third etched hole 70 is located between the first etched hole 51 and the second etched hole 52, and corresponds to the channel area 223, i.e. the projection of the third etched hole 70 on the stacked structure at least covers the channel area 223.

The third etched holes 70 do not expose the side surfaces of the stacked structures 20, that is, in the first direction Y, the width of the third etched holes 70 is less than that of the third trenches 25. In this way, it can be ensured that there is a gap between the subsequently formed first support structure and the active layer, so as to facilitate the formation of other film layers of the transistor.

Figure 17:
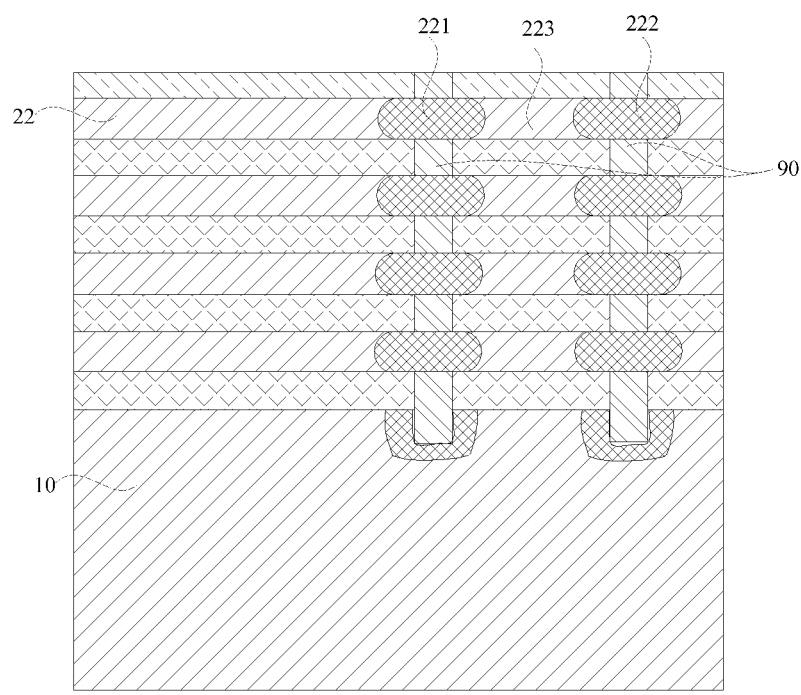
FIG. 17 is a sectional view in direction B-B after forming the support structure in the method for manufacturing a semiconductor structure provided by the embodiment of the disclosure.

After the third etched holes 70 are formed, referring to FIG. 16 and FIG. 17, a first support structure 80 is formed in the third etched holes, and a second support structure 90 is formed in the first trenches 211 and the second trenches 212.

For example, an insulating material may be formed by PVD or CVD. The insulating material located in the third etched holes 70 forms the first support structure 80. The insulating material located in the first trenches 211 and the second trenches 212 forms the second support structure 90. The material of the first support structure 80 and the second support structure 90 includes silicon nitride, but is not limited thereto.

The second support structure 90 is configured to support any two layers of active layers 22 in the vertical direction, so as to prevent the active layers 22 from tilting or collapsing, so that the yield of the semiconductor structure is improved.

In some embodiments, after forming the first support structure and the second support structure, the method for manufacturing a semiconductor structure further includes the following operations.

Referring to FIG. 18 to FIG. 21, the remaining second sacrificial layer and the remaining first sacrificial layers are removed, and the areas where the remaining second sacrificial layer and the remaining first sacrificial layers are located form a filling area.

Figure 18:
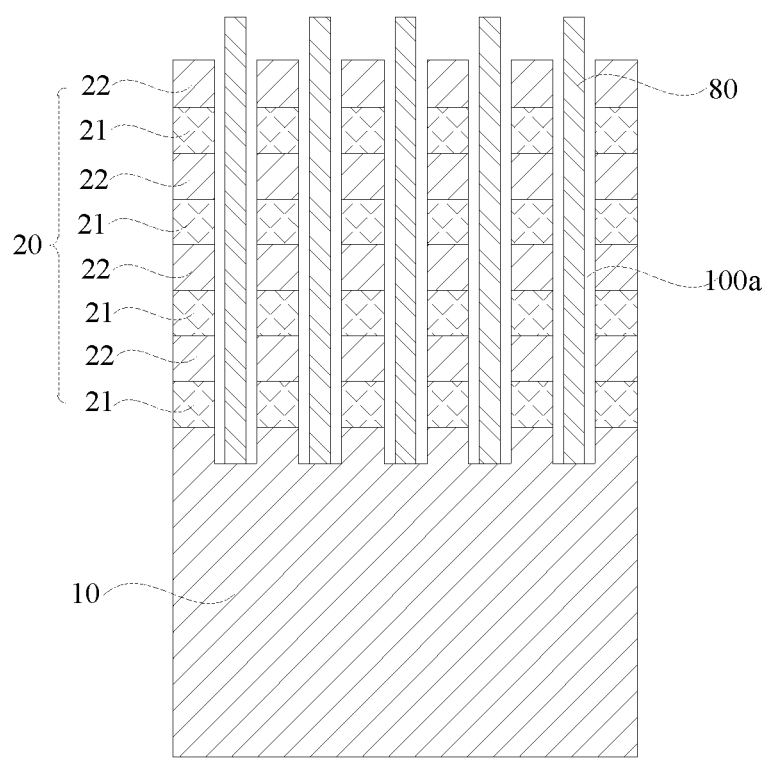
FIG. 18 is a sectional view in direction A-A after removing a remaining second sacrificial layer in the method for manufacturing a semiconductor structure provided by an embodiment of the disclosure.
Figure 19:
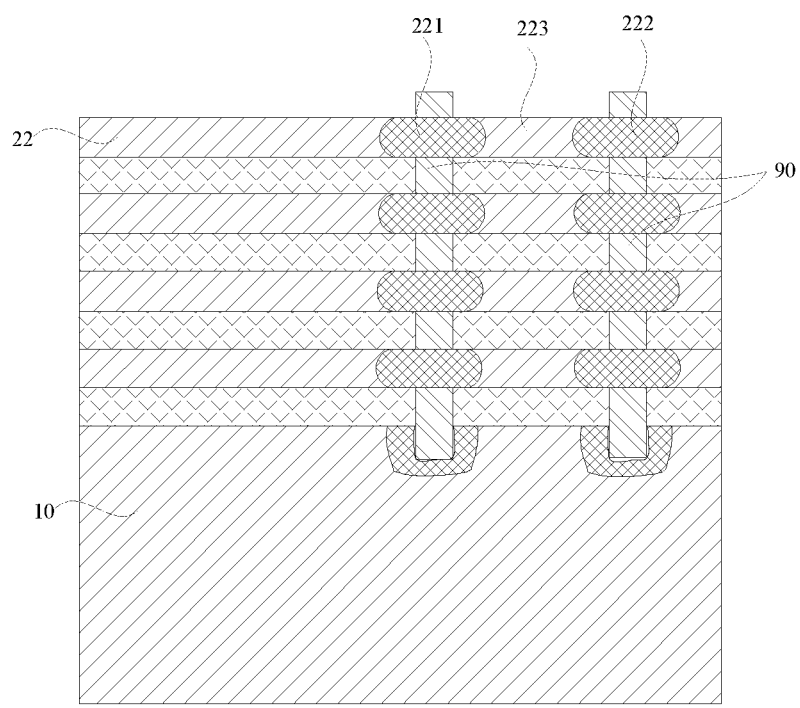
FIG. 19 is a sectional view in direction B-B after removing the remaining second sacrificial layer in the method for manufacturing a semiconductor structure provided by the embodiment of the disclosure.

For example, continuing to refer to FIG. 18 and FIG. 19, the second sacrificial layer 40 located between any adjacent stacked structures 20 may be wet-etched to expose the side surfaces of each column of stacked structure 20.

Figure 20:
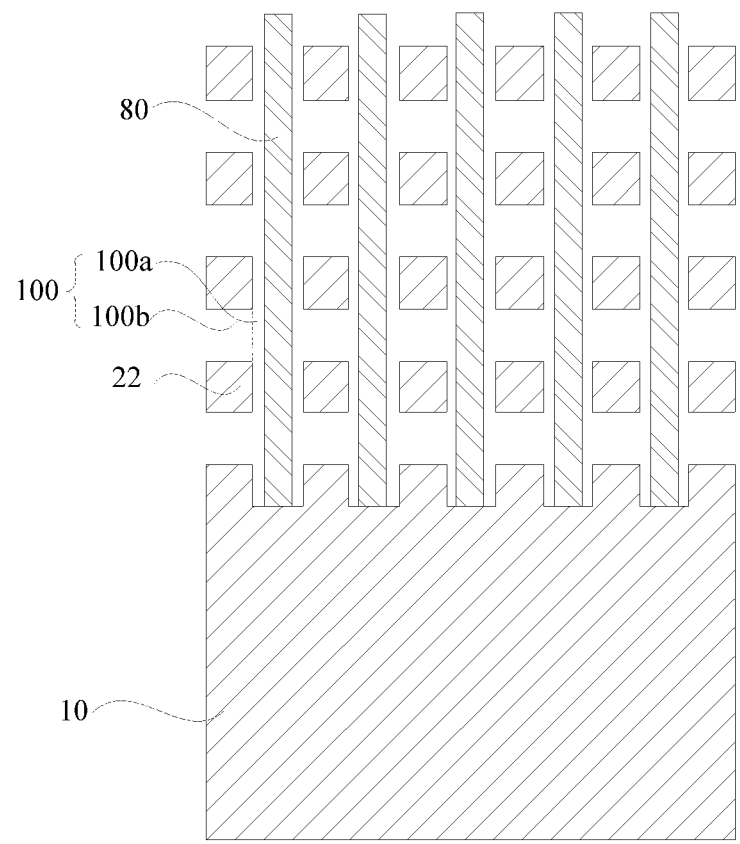
FIG. 20 is a sectional view in direction A-A after removing a remaining first sacrificial layer in the method for manufacturing a semiconductor structure provided by an embodiment of the disclosure.
Figure 21:
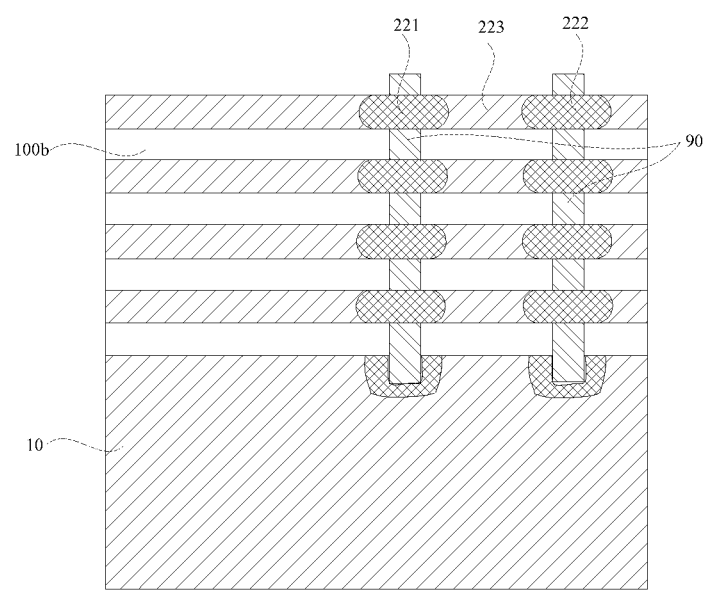
FIG. 21 is a sectional view in direction B-B after removing the remaining first sacrificial layer in the method for manufacturing a semiconductor structure provided by the embodiment of the disclosure.

Subsequently, referring to FIG. 20 and FIG. 21, the first sacrificial layers 21 in each stacked structure 20 is wet-etched to form a filling area 100. The filling area 100 may include a first filling area 100*a* and a second filling area 100*b* that are communicated with each other. The first filling area 100*a* is the area where the remaining second sacrificial layer 40 is located, and the second filling area 100*b* is the area where the remaining first sacrificial layers 21 are located.

Figure 22:
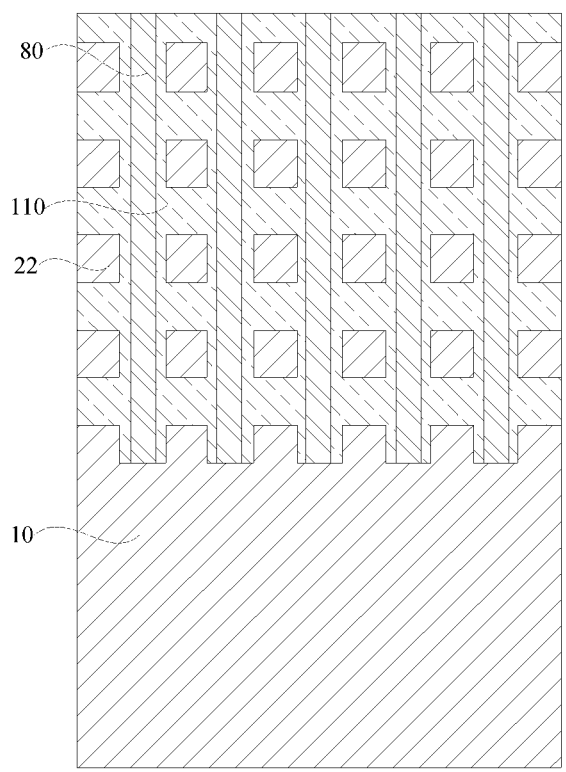
FIG. 22 is a sectional view in direction A-A after forming a dielectric layer in the method for manufacturing a semiconductor structure provided by an embodiment of the disclosure.
Figure 23:
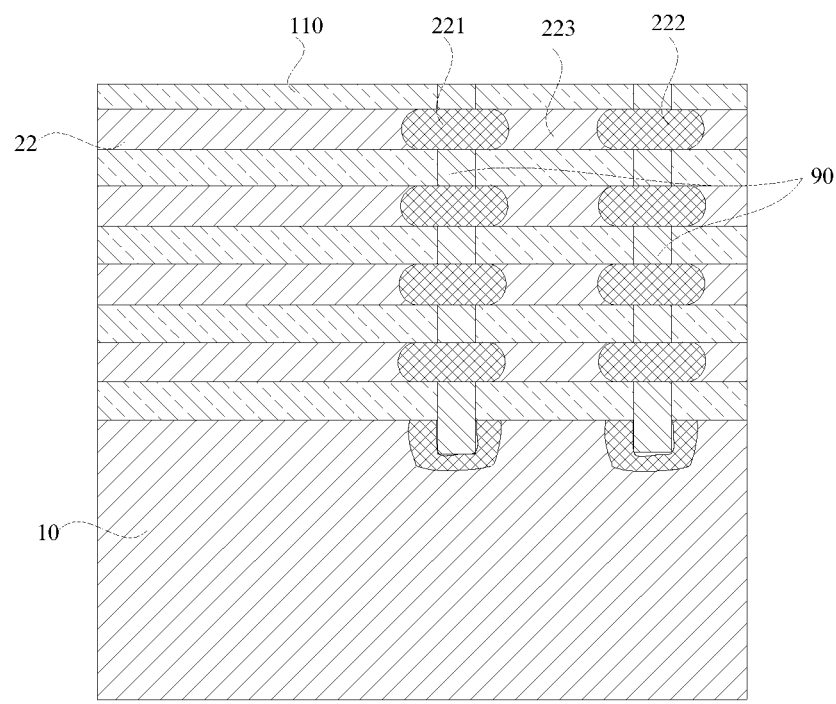
FIG. 23 is a sectional view in direction B-B after forming the dielectric layer in the method for manufacturing a semiconductor structure provided by the embodiment of the disclosure.

After the filling area 100 is formed, referring to FIG. 22 and FIG. 23, a dielectric layer 110 is formed in the filling area 100, and part of the dielectric layer 110 is removed to expose the channel area 223 of the active layer 22.

Figure 24:
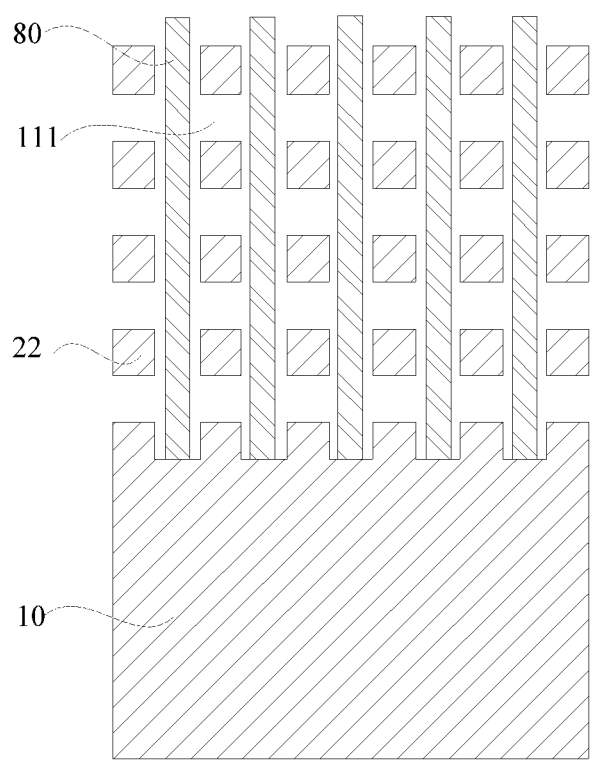
FIG. 24 is a sectional view in direction A-A after removing part of the dielectric layer in the method for manufacturing a semiconductor structure provided by an embodiment of the disclosure.
Figure 25:
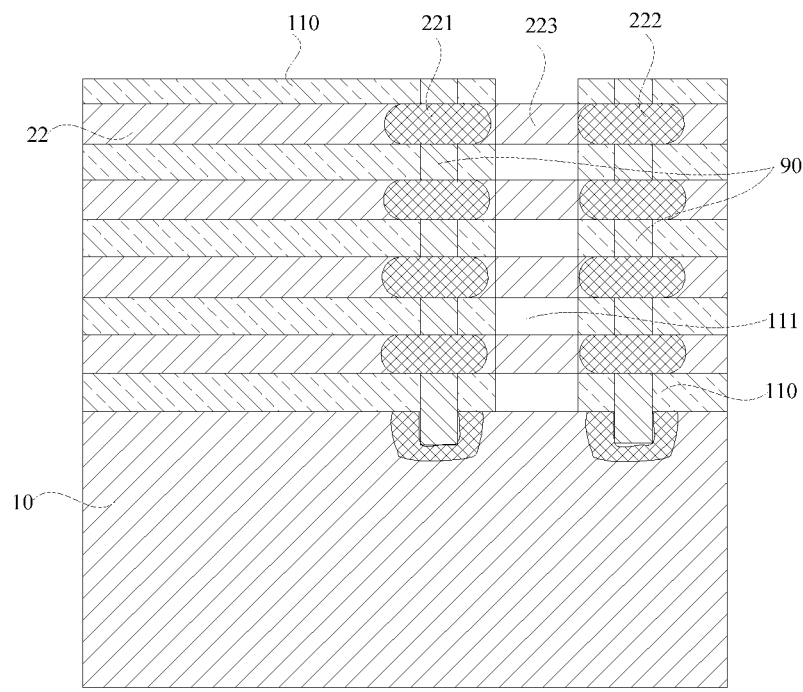
FIG. 25 is a sectional view in direction B-B after removing the part of the dielectric layer in the method for manufacturing a semiconductor structure provided by the embodiment of the disclosure.
Figure 26:
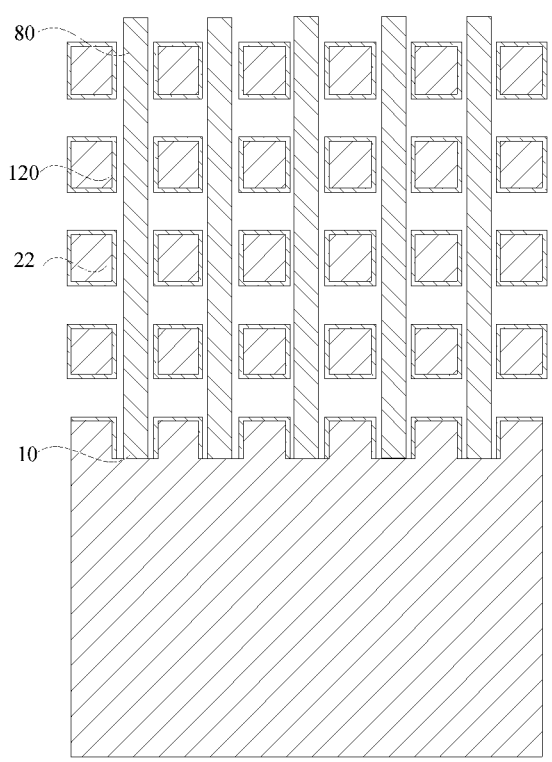
FIG. 26 is a sectional view in direction A-A after forming a gate oxide layer in the method for manufacturing a semiconductor structure provided by an embodiment of the disclosure.
Figure 27:
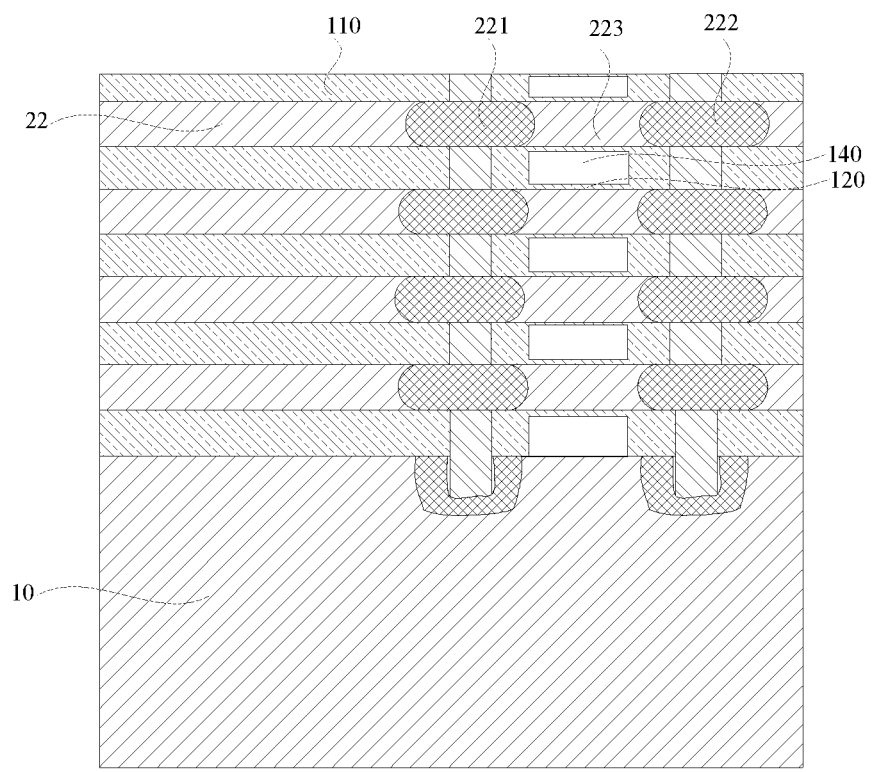
FIG. 27 is a sectional view in direction B-B after forming the gate oxide layer in the method for manufacturing a semiconductor structure provided by the embodiment of the disclosure.
Figure 28:
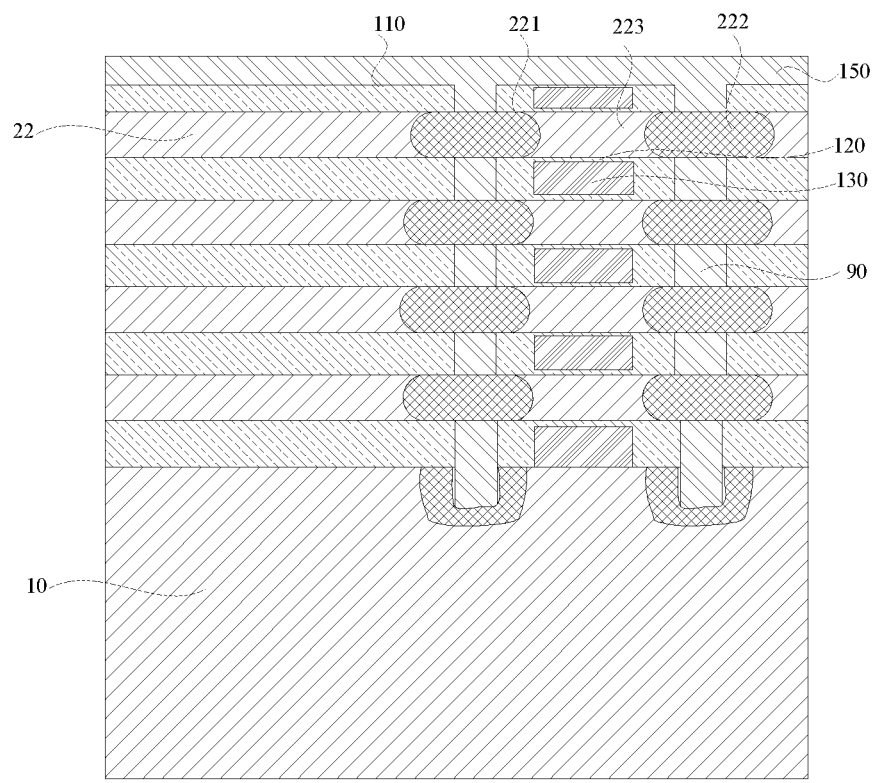
FIG. 28 is a sectional view in direction A-A after forming a conductive layer in the method for manufacturing a semiconductor structure provided by an embodiment of the disclosure.
Figure 29:
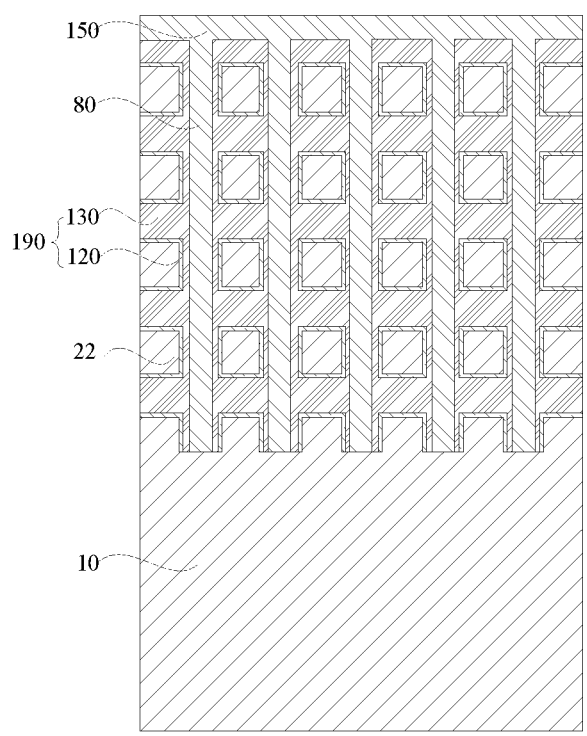
FIG. 29 is a sectional view in direction B-B after forming the conductive layer in the method for manufacturing a semiconductor structure provided by the embodiment of the disclosure.

For example, the dielectric layer 110 filling the filling area 100 may be formed by deposition. After that, referring to FIG. 24 and FIG. 25, the dielectric layer 110 is patterned to remove part of the dielectric layer 110, so as to form fourth trenches 111 in the dielectric layer 110. The fourth trenches 111 expose the channel areas 223 of the active layers 22.

Subsequently, referring to FIG. 26 to FIG. 29, a gate oxide layer 120 and a conductive layer 130 are formed on surface of each channel area 223 of the active layers 22 in sequence, and the gate oxide layer 120 and the conductive layer 130 form word line structures 190.

In a possible embodiment, the gate oxide layer 120 may be formed by selective deposition. For example, the gate oxide layer 120 may only be selectively formed on the surface of the channel area 223 of each active layer 22 through ALD. In this way, the material forming the gate oxide layer 120 can be prevented from filling the fourth trenches, so as to avoid removing part of the material forming the gate oxide layer 120 by etching again, thereby simplifying the manufacturing process of the gate oxide layer 120, and reducing the production cost for manufacturing the semiconductor structure.

In the embodiment, the gate oxide layer 120 has a high dielectric constant, which can improve the capacity of storing charges of the gate oxide layer, prevent electrons or a little of carriers generated by the conductive layer from entering the drain through the gate oxide layer, and reduce the gate induced drain leakage current, thereby improving the performance of the semiconductor structure.

A material with a high-k dielectric constant may include hafnium oxide ($HfO_2$), hafnium silicon oxide ($HfSiO_2$), lanthanum oxide (LaO), zirconium oxide ($ZrO_2$), zirconium silicon oxide ($ZrSiO_2$), tantalum oxide ($Ta_2O_5$), titanium oxide ($TiO_2$), barium strontium titanium oxide ($BaSrTiO_3$), barium titanium oxide ($BaTiO_3$), strontium titanium oxide ($SrTiO_3$), lithium oxide ($Li_2O$), aluminum oxide ($Al_2O_3$), lead scandium tantalum oxide (PbScTaO), lead zinc niobate ($PbZnNbO_3$), or combinations thereof.

After the gate oxide layer 120 is formed, the gate oxide layer 120 defines fifth trenches 140 in the fourth trenches. After that, referring to FIG. 28 and FIG. 29, conductive layers 130 filling the fifth trenches 140 are formed by deposition. The material of the conductive layers 130 includes tungsten, but is not limited thereto.

In some embodiments, after the conductive layer is formed, the method for manufacturing the semiconductor structure further includes that: an insulating layer 150 is formed. The insulating layer 150 covers the dielectric layer 110 and is connected to the first support structure 80 and the second support structure 90 to realize insulation between adjacent conductive layers 130.

The insulating layer 150, the first support structure 80, and the second support structure 90 may be made of the same material, and all of them may include silicon nitride.

The embodiments of the disclosure further provide a semiconductor structure. The semiconductor structure is prepared by the manufacturing method in the abovementioned embodiments. Therefore, the semiconductor structure also has the beneficial effects in the abovementioned embodiments. The embodiment will not be repeated herein.

Figure 30:
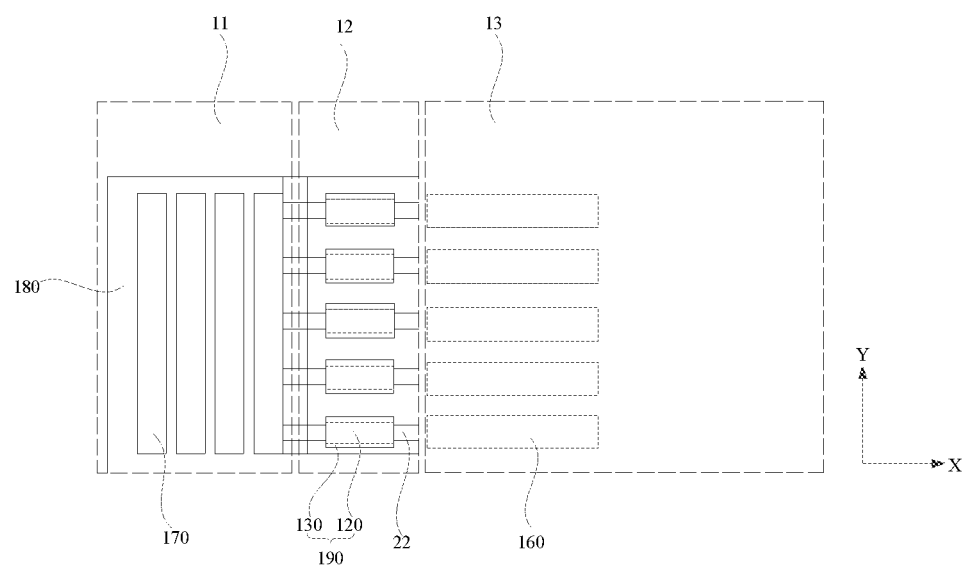
FIG. 30 is a schematic diagram 1 of a memory provided by an embodiment of the disclosure.

Referring to FIG. 30, the embodiments of the disclosure further provides a memory. The memory includes the semiconductor structure in the abovementioned embodiment, a memory structure 160, and a bit line structure 170.

The semiconductor structure, the memory structure, and the bit line structure all are arranged on the substrate 10. The semiconductor structure may include an active layer 22, a gate oxide layer 120, and a conductive layer 130. The gate oxide layer 120 and the conductive layer 130 form a bit line structure 190. The gate oxide layer 120 surrounds the channel area of the active layer 22. The conductive layer 130 extends along the direction perpendicular to the substrate 10. The conductive layer 130 is configured to connect all the active layers 22 located on the same column. The part, surrounding the channel area of the active layer 22, of the conductive layer 130 forms a transistor with the active layer 22, so as to form a gate all-around (GAA) field-effect transistor.

For example, the substrate 10 may include a first area 11, a second area 12, and a third area 13 connected in sequence. The bit line structures 170 are arranged on the first area 11, the semiconductor structure may be arranged on the second area 12, and the memory structure 160 may be arranged on the third area 13.

The memory structure 160 is electrically connected to either of the first doped area 221 or the second doped area 222, and the bit line structure 170 is electrically connected to the other of the first doped area 221 or the second doped area 222. In an example, the memory structure 160 may be connected to the first doped area 221, and the bit line structure 170 may be connected to the second doped area 222. In another example, the memory structure 160 may be connected to the second doped area 222, and the bit line structure 170 may be connected to the first doped area.

In the embodiment, the extending direction of the memory structure 160 is parallel to the substrate 10. Thus, under the same equivalent area, a plurality of stacked memory structures may be formed, so that the storage capacity of the memory structure can be increased, thereby improving the storage capacity of the memory.

The memory in the embodiments of the disclosure includes a plurality of silicon pillars (not shown in the drawings) arranged on the third area. The plurality of silicon pillars are arranged in one-to-one correspondence with the plurality of active layers 22, and one silicon pillar and one active layer are located on the same layer. The memory structure 160 may include a plurality of capacitor structures, and each capacitor structure may include a first electrode layer, a dielectric layer, and a second electrode layer that surround the silicon pillar in sequence.

The first electrode layer and the second electrode layer are made of the same material. The dielectric layer also has a high-k dielectric constant, so that the storage capacity of the memory structure can be improved.

In some embodiments, the bit line structure 170 includes a plurality of bit lines that are arranged at intervals in the second direction. The plurality of bit lines extend in parallel with each other along the first direction. Each bit line is configured to connect the first doped areas of all active layers located on the same layer, or is configured to connect the second doped areas of all active layers located on the same layer.

Figure 31:
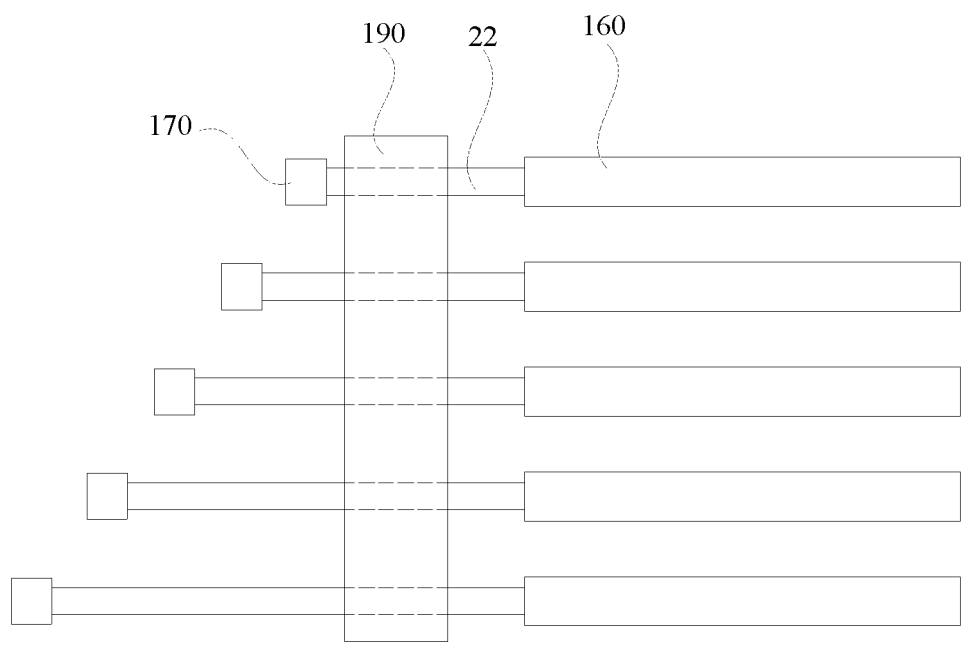
FIG. 31 is a schematic diagram 2 of the memory provided by an embodiment of the disclosure.

The plurality of bit lines are arranged in steps in the direction perpendicular to the substrate 10. As shown in FIG. 31, in the direction perpendicular to the substrate 10, the bit lines are arranged in steps in sequence from bottom to top, so as to facilitate electrically contact connection of the plurality of bit lines in a three-dimensional structure.

According to the embodiments, any two bit lines are arranged in a staggered mode, so as to facilitate the preparation of the rest data lines, and meanwhile, the spacing among these data lines is also increased, thereby preventing transmission signals from interfering with one another. In addition, the parasitic capacitance between the bit lines of an upper layer and a lower layer can also be reduced, thereby improving the performance of the memory.

The memory further includes an isolation layer 180. The isolation layer 180 wraps each bit line, so as to prevent various bit lines from being electrically connected with each other. The material of the isolation layer includes silicon oxide or silicon nitride.

Various examples or embodiments in the specification are described in a progressive manner. Each embodiment focuses on differences from other embodiments. Same and similar parts between the embodiments can be referred to each other.

In the description of the specification, the reference terms "one embodiment", "some embodiments", "illustrative embodiments", "example", "specific example", or "some examples" or the like refer to that the specific features, structures, materials, or characteristics described in combination with the embodiments or examples are included in at least one embodiment or example of the disclosure.

In the specification, the illustrative representation of the above terms does not necessarily refer to the same embodiments or examples. Further, the described specific features, structures, materials, or characteristics may be combined in a suitable manner in any one or more embodiments or examples.

Finally, it should be noted that the above embodiments are only used to illustrate the technical solutions of the disclosure, not limitation. Although the disclosure has been described in detail with reference to the foregoing embodiments, it should be understood by those of ordinary skill in the art that the technical solution described in the preceding embodiments can still be modified or some or all of the technical features thereof can be equivalently replaced; while these modifications or replacements are not intended to make the nature of the corresponding technical solution depart from the scope of the technical solution of the embodiments of the present disclosure.

What is claimed is:

1. A method for manufacturing a semiconductor structure, comprising:
    providing a substrate;
    forming a plurality of columns of stacked structures arranged at intervals in a first direction on the substrate, each stacked structure comprises a plurality of first sacrificial layers and a plurality of active layers that are stacked alternately;
    removing part of each of the first sacrificial layers to form a first trench and a second trench arranged at intervals in a second direction, part of a surface of each of the active layers being exposed in the first trench and the second trench, wherein the second direction intersects the first direction, and both the first direction and the second direction are parallel to a surface of the substrate; and
    performing ion doping on each of the exposed active layers to form a first doped area and a second doped area arranged at an interval in each of the active layers, wherein the active layer located between the first doped area and the second doped area forms a channel area.

2. The method of claim 1, wherein removing part of each of the first sacrificial layers comprises:
    forming a second sacrificial layer, the second sacrificial layer filling the areas between two adjacent ones of the stacked structures and covering top surfaces of the stacked structures; and
    removing part of the second sacrificial layer to form a plurality of etched holes in a direction perpendicular to the substrate, each of the etched holes being located between two adjacent ones of the stacked structures and exposing side surfaces of the stacked structures, and removing part of each of the first sacrificial layers along the etched holes.

3. The method of claim 2, wherein the etched holes comprise first etched holes and second etched holes; the first etched holes correspond to the first doped areas; and the second etched holes correspond to the second doped areas.

4. The method of claim 3, wherein after forming the first doped areas and the second doped areas, the method further comprises:
    forming a third etched hole in each of the second sacrificial layer located between two adjacent ones of the stacked structures, the third etched hole corresponding to the channel areas, the third etched hole being located between the first etched hole and the second etched hole and not exposing side surfaces of the stacked structures; and forming a first support structure in the third etched hole and forming a second support structure in each of the first trench and the second trench.

5. The method of claim 4, wherein after forming the first support structure and the second support structure, the method further comprises:

removing the remaining second sacrificial layer and the remaining first sacrificial layers to form a filling area;

forming a dielectric layer in the filling area, and removing part of the dielectric layer to expose the channel areas; and forming a gate oxide layer and a conductive layer in sequence on a surface of the channel area of each of the active layer.

6. The method of claim 5, wherein removing the remaining second sacrificial layer and the first sacrificial layers comprises:

wet etching the second sacrificial layer located between two adjacent ones of the stacked structures and wet etching the first sacrificial layers in each of the stacked structures to form the filling area.

7. The method of claim 5, wherein after forming the conductive layer, the method further comprises:

forming an insulating layer, the insulating layer covering the dielectric layer, and being in contact with the first support structure and the second support structure.

8. The method of claim 7, wherein the insulating layer, the first support structure, and the second support structure are made of the same material.

9. The method of claim 1, wherein forming a plurality of columns of stacked structures arranged at intervals in a first direction on the substrate comprises:

forming first initial sacrificial layers and initial active layers that are stacked alternately on the substrate;

forming a mask layer on a top most initial active layer, and patterning the mask layer to form a plurality of openings arranged at intervals in the first direction in the mask layer; and removing the first initial sacrificial layers and the initial active layers exposed in the openings, wherein the remaining first sacrificial layers and the remaining initial active layers form a plurality of columns of the stacked structures, and third trenches extending along the second direction are formed between two adjacent ones of the stacked structures.

10. The method of claim 9, wherein bottoms of the third trenches are located in the substrate.

11. The method of claim 1, wherein types of the doping ions of the first doped area, the second doped area, and the channel area are the same; and a concentration of the doping ions of the channel area is lower than concentrations of the doping ions in the first doped area and the second doped area.

12. The method of claim 1, wherein forming the first initial sacrificial layers and the initial active layers that are stacked alternately on the substrate comprises:

forming the first initial sacrificial layers and the initial active layers that are stacked alternately on the substrate by epitaxy, the first initial sacrificial layers comprising silicon germanium, silicon phosphide, or silicon nitride.

* * * * *